(12) United States Patent
Cheng

(10) Patent No.: US 8,623,685 B2
(45) Date of Patent: Jan. 7, 2014

(54) METHOD OF MANUFACTURING A LIGHT EMITTING DIODE

(75) Inventor: Kai Cheng, Leuven (BE)

(73) Assignee: IMEC, Leuven (BE)

(*) Notice: Subject to any disclaimer, the term of this patent is extended or adjusted under 35 U.S.C. 154(b) by 202 days.

(21) Appl. No.: 13/092,854

(22) Filed: Apr. 22, 2011

(65) Prior Publication Data

US 2011/0260211 A1 Oct. 27, 2011

(30) Foreign Application Priority Data

Apr. 22, 2010 (EP) .................................... 10160658

(51) Int. Cl.
*H01L 33/00* (2010.01)

(52) U.S. Cl.
USPC ...................................... 438/46; 257/E33.005

(58) Field of Classification Search
USPC .......................... 257/13, E33.005; 438/46, 47
See application file for complete search history.

(56) References Cited

U.S. PATENT DOCUMENTS 3,457,476 A * 7/1969 Dill ................................ 257/288
7,642,108 B2 1/2010 Krames et al.

FOREIGN PATENT DOCUMENTS

WO WO 2009023722 A1 * 2/2009

OTHER PUBLICATIONS

Hersee et al., "The Controlled Growth of GaN Nanowires", Nano letters, 2006, vol. 6, No. 8, pp. 1808-1811.
Wierer et al., "III-nitride photonic-crystal light-emitting diodes with high extraction efficiency", Nature photonics, vol. 3, Mar. 2009, www. nature.com/naturephotonics, pp. 163-169.

* cited by examiner

*Primary Examiner* — Thomas L Dickey
(74) *Attorney, Agent, or Firm* — Knobbe, Martens, Olson & Bear LLP

(57) ABSTRACT

A method of manufacturing a light emitting diode is disclosed. In one aspect, the light emitting diode has a carrier, an active layer structure of III-nitride type materials, and a photonic crystal structure of III-nitride type materials. The active layer structure includes a first active layer with an n-type doped layer and a p-type doped layer and suitably a quantum well structure. The photonic crystal structure includes periodically distributed trenches or periodically distributed pillars spaced by one or more trenches. The photonic crystal structure includes an overgrowth layer within which a diameter of a trench gradually increases, and a directional photonic crystal layer in which the diameter of a trench is substantially constant. The diode may be formed in a method wherein the directional photonic crystal layer is provided on a three-dimensional pattern that exposes selected areas of the first surface of the substrate.

8 Claims, 6 Drawing Sheets

METHOD OF MANUFACTURING A LIGHT EMITTING DIODE

BACKGROUND OF THE INVENTION

1. Field of the Invention

The disclosed technology relates to a method of manufacturing a light emitting diode provided with a photonic crystal structure and also relates to a light emitting diode manufactured therewith.

2. Description of the Related Technology

Light emitting diodes (LEDs) based on III-nitride type materials (GaN LEDs) are a heavy research subject. The type III-nitride materials is particularly gallium nitride (GaN) and higher alloys thereof, including aluminium gallium nitride (AlGaN), indium gallium nitride (InGaN), indium aluminium gallium nitride (1 nAlGaN) and the like. These materials may be used as blue light emitting diodes. The generation of light in semiconductor materials with first and second active layers is known per se: upon application of a certain voltage, charge carriers in the active layers recombine to generate photons. However, generated photons need to be able to leave the material. The issue is that radiation enters waveguided modes internal to the semiconductor rather than radiation modes. Light generated inside the semiconductor bounces around due to total internal reflection, and there is a high probability that the light will be absorbed before it can escape from the semiconductor material. One ways of reducing the issue is based on application of antireflection coatings and a textured surface.

An alternative way of reducing the issue is the provision of photonic crystals, or more adequately, a photonic crystal structure. Such a photonic crystal structure is typically designed as a dielectric layer or stack of dielectric layers provided with periodically distributed holes or trenches. The periodical distribution is for instance a triangular array. Electromagnetic waves, such as light, can be confined therewith in a small volume of three dimensions. Hence, the photonic crystals defining such small volumes are able to improve emission and guide light. As the external quantum efficiency of GaN LEDs is often in the vicinity of 10 percent, the formation of photonic crystals can improve the efficiency of a GaN LED in a substantial manner. Here the external quantum efficiency is the product of the internal quantum efficiency and the extraction efficiency. This improvement of efficiency is deemed due to a strongly modified emission pattern due to the scattering of waveguided modes out of the semiconductor material.

The periodically distributed trenches of the photonic crystal structure are typically defined by dry etching. This manufacturing process is complicated by the difficulty of etching the material, which is extremely hard and chemically inert. It inevitably results in imperfections leading to out-of-plane optical losses.

U.S. Pat. No. 7,642,108 discloses an improved method for manufacturing such GaN LEDs with a photonic crystal structure. This method uses a substrate transfer process in combination with epitaxial lateral overgrowth (ELOG). As known per se, GaN has the ability to grow in lateral directions when growth starts from a patterned template. The method of U.S. Pat. No. 7,642,108 provides a pattern to a substrate surface in the form of a mask. The mask is overgrown with ELOG. It is observed herein, that the lateral overgrowth leads to layer growth with reduced defect density. Hence, at the location of the mask GaN or AlGaN material is formed with a comparatively low defect density. At other locations, i.e. from where the growth started, the semiconductor material is formed with a comparatively high defect density. Thereafter an active layer structure is grown This active layer structure comprises a first active layer, that is n-type doped, and a second active layer, that is p-type doped. After this growth and the provision of a top electrode layer and protective layers as known per se to the skilled person, a substrate transfer process is carried out. Herein, a carrier is applied at the top side, and the original substrate is removed, for instance by grinding and etching. Therewith, the layer grown by the ELOG is exposed. The method of U.S. Pat. No. 7,642,108 now proceeds with etching, wherein the areas with a high defect density are removed. This etching continues through the active layer structure, in accordance with the same pattern. Probably, this is desired, as the quality of the active layers grown on the areas with the comparatively high defect density may well be lower than the quality of the active layers grown on the areas with the comparatively low defect density. The etching may be continued up to the carrier, but that is not necessary.

It is a disadvantage of the method known from U.S. Pat. No. 7,642,108 that it is still necessary to etch through the layers of III-nitride material. As stated before, the etching is difficult and requires a heavy etchant, such as a chlorine-based plasma. It may thus well damage the layers of III-nitride material. As not merely the layers formed by ELOG, but also the active layer structure is etched, this may have a negative impact on the reliability of the resulting device.

SUMMARY OF CERTAIN INVENTIVE ASPECTS

Certain inventive aspects relate to a method of manufacturing at least one light emitting diode provided with a photonic crystal structure. In one aspect, the method includes providing a substrate with a first surface, applying a pattern to the first surface, the pattern comprising periodically distributed, first areas, growing at least one layer of a III-nitride type material by means of epitaxial lateral overgrowth (ELOG), growing an active layer structure of III-nitride type materials comprising a first active layer that is n-type doped layer and a second active layer that is p-type doped, and removing the substrate and generating the photonic crystal structure with a pattern corresponding to the pattern applied to the substrate surface. In another aspect, the method includes (a) providing a substrate with a first surface suitable for growth of a III-nitride type material, (b) applying a pattern to the first surface, the pattern comprising periodically distributed, first areas and at least one second area spatially limiting the first areas, which pattern is embodied by means of cavities and protrusions, one of which leaves the first surface exposed, (c) in a first process, growing photonic crystal pillars of III-nitride type material on the first surface substantially in the first areas, when the first surface is exposed in the first areas, and growing at least one photonic crystal layer of III-material on the first surface substantially in the at least one second area, when the first surface is exposed in the at least one second area, (d) in a second process, growing an overgrowth layer of a III-nitride type material by means of epitaxial lateral overgrowth (ELOG) in both of the first areas and the at least one second area, (e) in a third process, growing an active layer structure of III-nitride type materials comprising a first active layer that is n-type doped layer and a second active layer that is p-type doped, and (f) removing the substrate at least partially for formation of the photonic crystal structure from the overgrowth layer and either the photonic crystal pillars or the photonic crystal layer.

By providing a three-dimensional pattern into or on the substrate, rather than merely a pattern on the substrate surface, the etching process necessary in the prior art can be left out. Moreover, it is observed that the presence of the photonic crystals—as pillars or as a layer with trenches—between substrate and overgrown layer tends to improve the quality of the overgrown layer in areas corresponding to where growth started. This is particularly achieved in that the substantially confined shape of the photonic crystals does not exclude that there is some lateral growth, as a result of which the width of the intermediate trenches is reduced. So, overall, the overgrowth occurs more gradual.

For reasons of simplicity, the photonic crystals, either embodied as pillars or as a layer with trenches, will hereinafter also be referred to as directional photonic crystal layer.

Suitably, the photonic crystal structure is provided with one or more trenches between the photonic crystal pillars or with trenches in the photonic crystal layer. The trenches extend into the overgrowth layer and result from the growth in the first process in either substantially the first areas or substantially the at least one second area. The trenches may be formed either in the first process or after the first process by removal of a template layer. Alternatively one could say that the trenches result from the selective and directional growth in the first process in either the first or the second areas. At the end of the first process, these trenches are either empty or filled or partially filled, particularly with a template layer used to define the pattern.

In one embodiment, the three-dimensional pattern is created by transferring the pattern into the substrate. This is for instance done by etching, therewith creating the cavities. The first surface is then exposed on top of the protrusions; effectively the first surface is exposed in as far as it is still present. The cavities, typically having trench-like shape, may have side faces, on which growth of III-nitride material is inhibited partially or completely. The cavities further may have bottom faces on which growth of III-nitride material is inhibited. However, with sufficient height of the protrusions and sufficient distance between the protrusions, this is not necessary.

In an alternative embodiment, the three-dimensional pattern is created by provision of a template layer on top of the substrate. This is for instance an oxide layer, such as a thermal oxide, that is subsequently patterned. Other materials may be used alternatively or additionally. Following criteria are important for selection of such materials: they are able to withstand growth temperatures for epitaxial growth of III-nitride materials; growth of III-nitride materials on their surface is inhibited substantially completely; removal of the material selectively to the grown III-nitride material is feasible. Oxide materials appear most suitable therefore, but other materials and layer stack with different materials are not excluded. In one implementation, the template layer is removed before growth of the overgrowth layer. In another implementation, the template layer is removed after removal of the substrate.

After formation of the three-dimensional pattern, the growth of III-nitride material occurs in three major processes. Directional growth occurs in the first process; overgrowth occurs in the second process; an active layer structure is formed in the third process. The first process differs from the second process in that the lateral growth speed is reduced, and typically inhibited completely or to a large extent. An additional process may be carried out between the second and the third process to provide a transition layer.

It is observed for clarity that each process may involve the growth of different layers having different or equal compositions. It is however preferred that during composition changes are applied by changing the composition of the reactor chamber without removing the substrate from the reactor intermediately. It is most preferred that the first, second and third process are carried out consecutively, i.e. without an intermediate removal of the substrate from the reactor chamber. It is further suitable that the layer composition at the top of one layer (f.i. the overgrowth layer) is similar to the layer composition at the bottom of the subsequent layer (i.e. the active layer structure or the transition layer).

In one important embodiment of the first process, the directional photonic crystal layer comprises a material chosen from the group of AlN, AlGaN and AlInGaN with an Al content of at least about 25%. These materials prefer directional growth, i.e. also referred to as vertical growth, over lateral growth. Moreover, the larger Al-content leads to a more uniform dielectric constant. GaN is known to have anisotropic dielectric properties, which is a disadvantage so as to obtain a photonic crystal structure with uniform properties. AlN does not have this anisotropy. Suitably, the directional photonic crystal layer comprise $Al_xGa_{1-x}N$, wherein the Al molar ratio x is about $0.25 \le x \le 1$. The directional photonic crystal layer can comprise multiple layers having different Al molar ratios, or a single layer having a gradual Al molar ratio, with the highest Al ratio at the interface with silicon. In one aspect, overlying and in contact with silicon an AlN layer (x=1) is first grown. Thereafter, an $Al_xGa_{1-x}N$ layer with constant or gradual Al molar ratio is grown, wherein $0.25 \le x \le 1$.

In the second process, the trenches are overgrown. Herein, a diameter of the trenches decreases from the bottom to the top of the overgrowth layer. In a preferred embodiment of the second process, the lateral growth speed in the ELOG process is controlled. The control is deemed beneficial for tuning the shape of the trenches and for specifying the thickness and growth quality of the overgrowth layer. The overgrowth layer effectively will constitute the portion of the photonic crystal structure that is nearest to the active layer structure. It is therefore important that the layer is grown with a minimum of defects. It is further important that the shape of the trenches is optimized to enable a large outcoupling of the light from the active layer structure into the photonic crystal structure.

Various options are available for controlling the lateral growth speed. In a first option, the overgrowth layer comprises aluminum in a molar ratio of about 5 to 25%, i.e. $Al_xGa_{1-x}N$, wherein approximately $0.05 \le x \le 0.25$. Alternatively or additionally, the lateral growth is controlled using Si doping. A further option is the supply of precursors in the reactor chamber alternatively during the epitaxial growth process, as known from Nano lett. 6, 1808 (2006), which is incorporated herein by reference. The precursors are for instance ammonia ($NH_3$), tetramethyl Gallium (TMGa), tetraethyl gallium (TEGa), trimethylaluminium, triethylaluminium. Other precursors as known to the skilled person, may be supplied as well. It is observed that the lateral growth speed may be constant or varying. A suitable embodiment is one wherein the lateral growth speed increases from the bottom to the top. The variation may be gradual but also step-wise.

The thus formed top section of the trench with decreasing diameter will be hereinafter referred to as the tip of the trench and the tip of the periodically distributed trenches of the photonic crystal structure. The term 'tip' is not to be interpreted that the top of the trench is a sharp tip; typically the top will be rounded. Suitably, the tip includes, when seen in a cross-sectional view, sidewalls including an angle of less than about 60 degrees with the main orientation of the trench. More particularly this angle is less than about 45 degrees, for instance about 15-40 degrees. This angle is, in accordance with one inventive aspect, not merely present at a single point on the sidewall. Instead, there is a portion of the sidewall between a first and second height in the overgrowth layer that on average includes the angle. The distance between the first and second height may be more than half the thickness of the overgrowth layer. The variation in the angle between the first and second height may be less than about 20 degrees.

After the second process and before the third process, a transition layer may be grown between the overgrowth layer and the active layer structure. This layer on the one hand allows accommodation of changes in composition between the overgrowth layer and the active layer structure, including for instance n-type doping. This transition layer furthermore defines a distance between the active layer structure, particularly including a quantum well structure, and the photonic crystal structure. The effect of the photonic crystal structure on the outcoupling of light from the active layer structure typically reduces with the distance between both of them. Setting the thickness of the transition layer therefore also defines the amount of outcoupling. Suitably, the transition layer has a thickness of less than about 2.0 and more particularly less than about 1.0 microns, and particularly of at least about 0.25 microns, more particularly at least about 0.5 microns. In one embodiment, it is preferably relatively thin in comparison to the directional photonic crystal layer. In the event that a trench with a tip is present, the thickness of the transition layer is measured as between the tip and the active layer structure.

The third process involves formation of the active layer structure. In a preferred embodiment, a quantum well is provided. Quantum wells are known per se. In one embodiment, a quantum well is formed by deposition of a layer stack of alternating layers of a first and a second material. The layers are typically thin, for instance less than about 10 nm, particularly in the range of about 1 to 7 nm. In the context of GaN LEDs, a well known combination is a first material of GaN and a second material of InGaN. However, alternative combinations are not excluded. Quantum well structures are advantageous as they have a high radiative efficiency due to improvement of the injection efficiency. This improvement is deemed due to carrier confinement in the action reaction and reduced carrier leak. Moreover, surface recombination is less important in quantum well structures as compared to bulk material. Use may be made of a multiple quantum well, as it has a larger volume than a single quantum well, and thus allows for higher light powers. Typically, due to the deposition of alternating semiconductor layers, the quantum well structure is embodied as a superlattice structure. This results in modification of the bandgap. As compared to a multiple quantum well, a superlattice has thin barriers, so that tunnelling between wells can occur, and thus transport of carriers along the direction perpendicular to the superlattice planes. This results in a more uniform carrier distribution.

The quantum wells in the GaN LED comprise in one embodiment an intermediate region between the p-type doped and the n-type doped region. The intermediate region may be intrinsically doped, so as to obtain a p-i-n diode structure. Alternatively, the intermediate region may be doped, for instance with Si.

The use of photonic crystals is particularly beneficial in combination with quantum well structures, as the plurality of planes and the limited volume tend to strengthen waveguide modes of radiation transport. One inventive aspect allows that no etching through the quantum well structure is needed. In view of the plurality of layers, such etching through the quantum well structure very easily leads to damage.

In one inventive aspect, the substrate comprises a handling wafer, a buried layer and a top layer. The pattern is transferred to the top layer, and the removal of the substrate comprises removal of the handling wafer and the buried layer. One important example of such a substrate is an SOI, e.g. silicon on insulator substrate. The top layer of the SOI substrate is suitably a silicon substrate with a (111) orientation, though (001) and (110) orientation are not excluded; it has been found that layers of III-nitride type materials can be grown hereon successfully. The silicon top layer may be patterned by etching as known in the art. The patterning moreover tends to reduce stress between the silicon substrate and the III-nitride type materials. In addition, the crystal quality can also be improved.

In a suitable implementation, the pattern is further transferred to the buried layer, in particular a buried insulating layer. Because of the selectivity in wet chemical etching of Si, $SiO_2$ and III-nitrides, the buried insulating layer facilitates removal of the substrate in a lift off process. By using this lift-off process, wafer grinding or backside chemical etching can be avoided. Moreover, such a lift-off process has the advantage that the handling wafer can be reused.

In a further implementation, the patterned top layer is relatively thin, for instance less than about 1 micron, particularly at most about 100 nm or even at most about 20 nm. A reduced thickness has the advantage that growth of III-nitride material on the side face of the top layer is minimized (even though such growth on the side face may anyhow be limited due to the different orientation of the exposed crystal surface).

A reduced thickness has furthermore the advantage that the top layer does not need removal by etching due to its optical transparency. As known per se, silicon becomes transparent when very thin. However, the silicon layer may also be removed, for instance by etching. Removing the silicon top layer appears to improve the properties of the photonic crystal, as it reduces the risk that radiation is reduced in the silicon. As is known, silicon has a bandgap of 1.1 eV, while blue light has 2.5 eV entry.

In another inventive aspect, a semiconductor body is provided. The body is provided with a substrate with a first surface suitable for growth of a III-V material, a pattern being applied to the first surface. The pattern comprises periodically distributed, first areas and at least one second area spatially limiting the first areas. The pattern is embodied by means of cavities and protrustions, one of which leaves the first surface exposed. A plurality of photonic crystal pillars or a photonic crystal layer of a III-nitride type material is present on the exposed first surface of the substrate. Optionally, filled or partially filled trenches are present between the photonic crystal pillars or in the photonic crystal layer. An overgrowth layer of a III-nitride type material, in which the trenches are overgrown.

This body is the intermediate product of the method as described herein. The trenches are in one embodiment filled with a template layer, which defines the pattern applied to the first surface. In an alternative and preferred embodiment, the substrate comprises a patterned semiconductor top layer having layer portions with the first surface separated through trenches. The photonic crystal layer or photonic crystal pillars respectively of a III-nitride type material are present on the first surface. Hence, the trenches in the semiconductor top layer extending through the photonic crystal layer or between the photonic crystal pillars. The body further comprises an overgrowth layer of a III-nitride type material, in which the trenches are overgrown.

In one inventive aspect, the overgrowth layer defines sidewalls to the trenches, the sidewalls including, between a first height and a second height within the overgrowth layer, an angle of on average at most about 60 degrees with reference to a primary orientation of the trench.

The semiconductor body is effectively an intermediate product that may be supplied by wafer manufacturers to device manufacturers and includes the functionality of the photonic crystal structure. Particularly in the event that the trenches are provided with tips, requirements to the pitch between the trenches tend to be less strict. This allows that the intermediate product may be manufactured without a need for transmission of detailed device know-how to the wafer manufacturer. It is added for clarity that one could refer to the pitch between the pillars defined in the photonic crystal layer and the underlying top layer of the substrate, instead of referring to the pitch between trenches.

The diameter of the trenches is in a suitable embodiment between about 0.25 and 2.5 microns. The pitch between trenches or pillars is in a suitable embodiment between about 0.4 and 5.0 microns.

In one inventive aspect, a transition layer of III-nitride material is provided on top of the overgrowth layer. An active layer structure may be present thereon. Their presence also depends on the requirements on such an intermediate product. Suitably, the intermediate product is protected with a protection layer, which may be in situ grown, for instance a protection layer of SiN. Before continuation of processing onto the body, this protection layer would be removed.

In another inventive aspect, there is a light emitting diode comprising a carrier, an active layer structure of III-nitride type materials, and a photonic crystal structure of III-nitride type materials. The active layer structure comprising a first active layer that is n-type doped layer and a second active layer that is p-type doped. In one inventive aspect, it further comprises a quantum well structure. The photonic crystal structure is patterned to define periodically distributed trenches or periodically distributed pillars spaced by trenches. The photonic crystal structure comprises an overgrowth layer within which a diameter of a trench gradually increases, and a directional photonic crystal layer in which the diameter of a trench is substantially constant. This substantially constant is understood, in certain embodiments, that the diameter of the trench varies in the photonic crystal layer with less than about 50%, particularly less than about 20%.

In one suitable embodiment, a transition layer is present between the active layer structure and the photonic crystal structure. The transition layer is defined so as to provide coupling of radiation generated in the active layer structure and present in a waveguide mode into the photonic crystals. The coupling suitably occurs by scattering, though other coupling mechanisms are by no means excluded. The presence of a transition layer is particularly beneficial, when the periodically distributed trenches of the photonic crystal structure have a diameter that is substantially larger than the emitting wavelength. There is an active layer structure that is not etched and that has a beneficial quality in terms of defect density due to its growth on top of a directional photonic crystal layer and a transition layer. The transition layer and the photonic crystal structure enable that light is scattered or otherwise coupled from the waveguide mode into photonic crystals and from continues in a guided mode in which it is able to leave the semiconductor material.

The transition layer is typically optimized for the scattering process. Suitably, it has a layer thickness of less than about 2.0 microns and more particularly at most about 1.0 microns. Suitably, the thickness is at least about 0.2 microns and particularly about 0.5 microns. If the photonic crystal structure is provided with trenches having tips, this layer thickness is defined as from the top of the tips. The tip may have a substantially concave surface. The concave surface suitably includes first and second portions that mutually include an angle larger than about 90°. The shape of this concave surface is suitably optimized so as to maximize scattering.

Further embodiments discussed with reference to the method, both above and in the following, may also be combined with the device described herein.

BRIEF DESCRIPTION OF THE DRAWINGS

These and other aspects will be further elucidated with reference to the Figures, in which.

DETAILED DESCRIPTION OF CERTAIN ILLUSTRATIVE EMBODIMENTS

Figure 1:
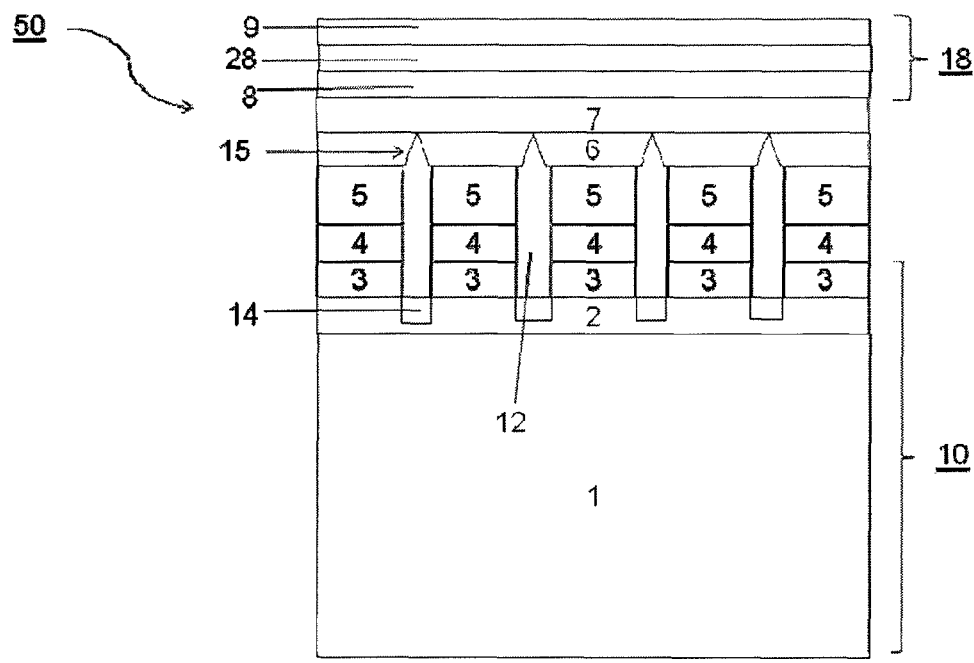
FIG. 1 shows a diagrammatical, cross-sectional view of a semiconductor body according to one embodiment.

The figures are not drawn to scale and equal reference numerals in different figures refer to the same or similar parts. The following embodiments merely show illustrative examples and are not intended for limiting the scope of the disclosure.

FIG. 1 shows a diagrammatical, cross-sectional view of a semiconductor body 50 according to a first embodiment of the disclosure. The semiconductor body 50 is an intermediate product in which at least some processes of one embodiment of the method are embodied. The body 50 comprises a substrate 10, which comprises in this embodiment a handling wafer 1, a buried layer 2 and a top layer 3. The substrate 10 is typically a silicon-on-insulator (SOI) substrate, with for instance a silicon oxide as the buried layer 2. In view of the growth of layers of III-nitride material on top of the substrate, the top layer 3 is typically chosen as a material suitable for such growth. Typical examples of suitable top layers are monocrystalline silicon layers with a (111), a (001) or a (110) orientation. Other semiconductors are also suitable as top layer, e.g., SiC layers or Ge layers. The layer thickness of the top layers is typically in the order of about 10 nm to 20 microns, particularly about 1 to 10 microns, but that is not limiting. The handling wafer 1 may be chosen so as to be resistant against warpage effects that may arise as a consequence of differences in thermal expansion between the substrate 10 and layers of III-nitride material grown thereon.

Though advantageous for the removal process, it is by no means necessary that the substrate is an SOI substrate. Other methods for appropriate removal of the substrate 10 than through the use of an buried layer 2 that can be selectively removed, are known per se. One may for instance use a p-n junction in the substrate as an etch stop. Hence, a silicon substrate, particularly monocrystalline silicon with a (111), (110) or (100) orientation, may be used alternatively.

The present body 50 comprises trenches 12 each of which is provided with a tip 15. The tip 15 is obtained during growth of an overgrowth layer 6 by means of elongated lateral overgrowth (ELOG) of the trenches 12. The ELOG process is therein optimized so as to tune the ratio between lateral growth and directional growth, the latter also being referred to as vertical growth. In a preferred embodiment, the lateral growth speed in the ELOG process is reduced to achieve a gradual overgrowth. Various options are available for reduced the lateral growth speed while forming the overgrowth layer. In a first option, the overgrowth layer comprises aluminum in a molar ratio of about 5 to 25%, i.e. $Al_xGa_{1-x}N$, wherein approximately $0.05 \leq x \leq 0.25$. Alternatively or additionally, the lateral growth is controlled using Si doping. A further option is the supply of precursors in the reactor chamber alternatively during the epitaxial growth process, a pulsed MOCVD growth mode as known from Nano lett. 6, 1808 (2006), which is incorporated herein by reference. The precursors are for instance ammonia ($NH_3$), tetramethyl gallium (TMGa), tetraethyl gallium (TEGa), trimethylaluminium, triethylaluminium. Other precursors as known to the skilled person, may be supplied as well.

In the present embodiment, the growth has been tuned so as to obtain sidewalls of the tip 15 including an oblique, sharp angle with the primary orientation of the trench 12. In one embodiment, the angle is smaller than about 45 degrees and is in this example approximately about 30 degrees. Though the present FIG. 1 shows the sidewalls as straight, it will be understood that this is a diagrammatical representation, and that in practice the sidewalls are at best straight on average. While the present FIG. 1 shows the straight sidewalls as extending from the bottom to the top of the overgrowth layer, it is to be understood that this is not deemed necessary. Generally speaking, the sidewalls have a first portion with sidewalls that are more or less straight. The first portion therein extends between a first height and a second height within the overgrowth layer. The distance between the first and second height is for instance about 30% or 50% or 70% of the thickness of the overgrowth layer 6.

It appears that it is most suitable to provide sidewalls with a concave shape. Instead of sidewalls that are on average straight and/or generally concave, sidewalls provided with processes or a sidewall with a sinusoidal shape are not excluded. The present figure effectively shows a single overgrowth layer. It is however not excluded that the overgrowth layer comprises several sublayers with different compositions. Typically, the overgrowth layer 6 comprises AlGaN, with an Al-content between about 5 and 25%, but the overgrowth layer may alternatively include a material that comprises In, for instance AlInN, AlGaInN and the like.

The present body 50 comprises a transition layer 7 on top of the overgrowth layer 6. Such transition layer 7 is beneficial for a regular growth of the active layer structure 18 with active layers 8 and 9 and a quantum well structure 28 on top thereof. Suitably, the transition layer 7 has a thickness of at most 2 micron, more particularly at most 1.0 microns. However, a transition layer 7 that has a large thickness is detrimental for the interaction between the active layer structure 18 and the photonic crystal structure to be formed from the layers 4, 5 and 6. In the event that the transition layer 7 is present on an overgrowth layer 6 in which the trenches 12 extend as tips 15, the transition layer 7 may even be smaller than 0.5 microns to combine excellent growth of the active layer structure 18 with an appropriate coupling of light generated in the active layer structure 18 into the photonic crystal structure. It is therein believed by the inventor, that the transition layer 7 avoids surface recombination due to the large interface surface area in the photonic crystals. Therewith, it may transfer a surface effect from the photonic crystal structure to the electromagnetic field present in the active structure 18. This results in coupling waveguide mode radiation to optical mode radiation.

Figure 2:
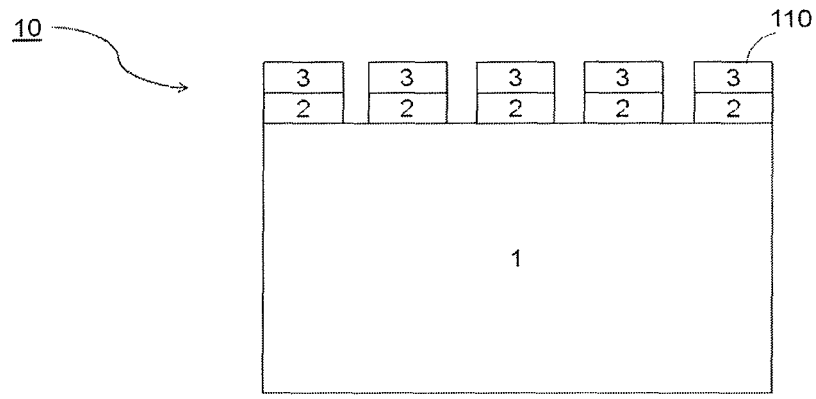
FIG. 2-4 shows diagrammatical, cross-sectional views of three stages in the method according to one embodiment, resulting in a semiconductor body according to a second embodiment.
Figure 3:
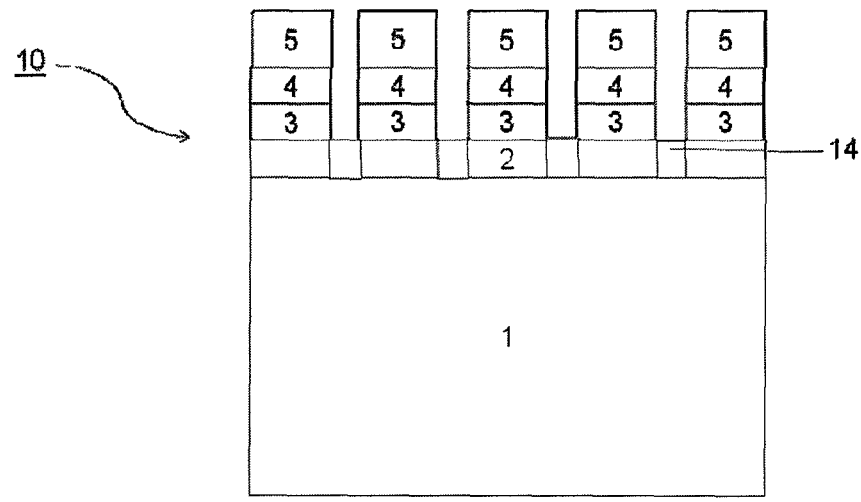
Figure 4:
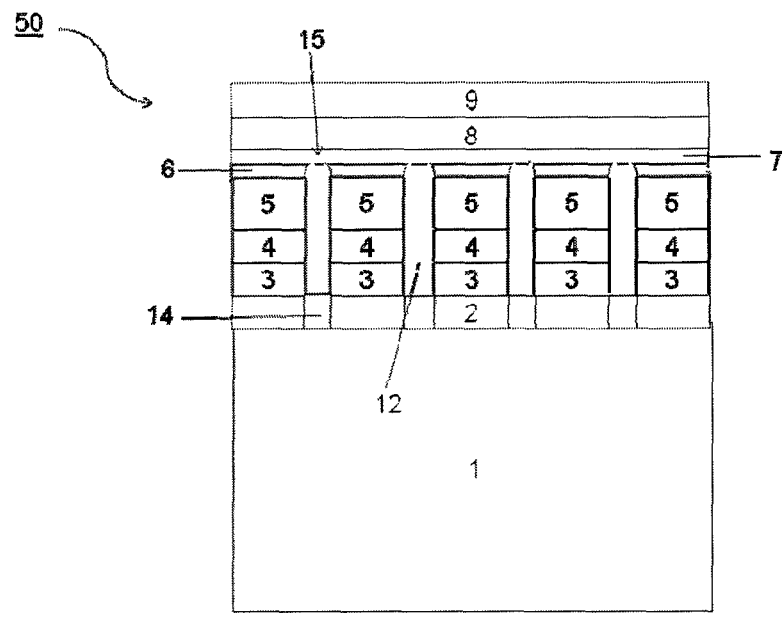

FIGS. 2 to 5 show cross-sectional diagrammatical views of several stages in the method in accordance with one embodiment. The method results in the light emitting diode 100, as shown in FIG. 6. The semiconductor body 50 as shown in FIG. 4 is obtained as an intermediate product.

FIG. 2 shows the semiconductor substrate 10, after carrying out a first plurality of processes in accordance with one embodiment. Herein, the substrate 10 is provided with a first surface 110. A pattern is applied to the first surface 110, for instance in the form of a photo resist layer, hard mask or the like. The pattern comprising periodically distributed, first areas and at least one second area spatially limiting the first areas. Suitably, the first surface 110 is exposed in the first areas. When transferring the pattern to the top layer 3 of the substrate 10, trenches 12 surrounded by remaining parts of the substrate 10 in the second area will be formed. Alternatively, the first surface 110 is exposed in the at least one second area. As a result, the top layer 3 of the substrate 10 is patterned into pillars (or exposed protrusions). Though the periodical distribution may extend in two dimensions, an extension in a single dimension may be sufficient.

Figure 8:
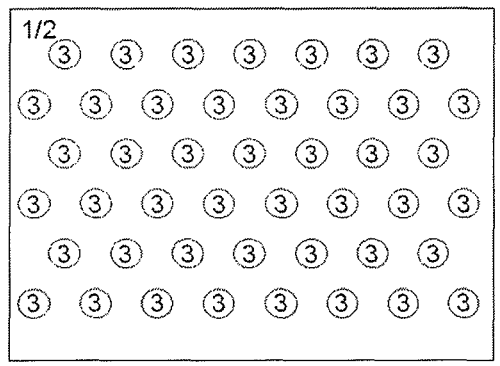
FIG. 8-10 show in diagrammatical top view three examples of the pattern used in one embodiment.
Figure 9:
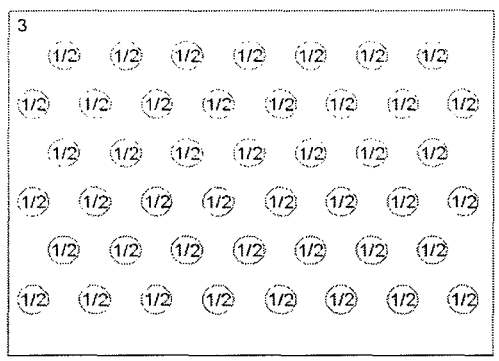
Figure 10:
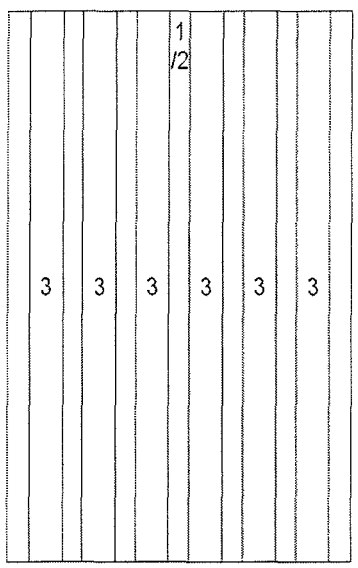

Examples of suitable patterns are shown in diagrammatical top views in FIG. 8-10. FIG. 8 shows a first example, resulting in the formation of pillars in the top layer 3 of the substrate 10. The pillars are mutually spaced with one or more trenches. FIG. 9 shows a second example, resulting in trenches 12 (holes) exposing at the bottom the underlying buried layer 2 or handling wafer 1 and having sidewalls in semiconductor material 3 (i.e. in the embodiment where an SOI substrate is used, otherwise merely the substrate is exposed). Though reference is made to trenches for conciseness, it is to be understood that both options are included. The pillars and trenches of FIGS. 8 and 9 are shown with circular shape, but may be provided with an alternative shape, such a hexagon or the like. FIG. 10 shows an example of a one-dimensional pattern comprising stripes of semiconductor material and slit-shaped trenches exposing the underlying buried insulating layer 2 or handling wafer 1 (in the embodiment wherein an SOI substrate is used). Alternatively, the pattern may comprise ring-shaped trenches, C-shaped trenches, U-shaped trenches, W-shaped trenches and any combination thereof. It is not necessary that the trenches have identical shape over the complete substrate surface 110. It is not needed that the same pattern over the full substrate surface 110. Instead it may be limited to certain zones. For instance, the top layer 3 may be removed in areas intended for use as saw lanes. This has several advantages. First, one does not need to saw through the III-nitride material upon dicing. Not only is III-nitride material comparatively hard, but it is known to be difficult to saw through a stack of two different materials. Secondly, the III-nitride material is therewith effectively subdivided into blocks. As a result, stress due to differential thermal expansion between the silicon substrate and the III-nitride type material may be considerably reduced.

Returning to FIG. 2, it is shown therein that the pattern is transferred to both the top layer 3 and the buried layer 2. This is not necessary, but turns out beneficial upon removal of the substrate 10, as will be discussed hereinafter. The transferring of the pattern is typically carried out by etching, for instance by dry etching. It is most beneficial that herein the underlying handling wafer 1 is exposed, but this is not deemed necessary.

In the embodiment that a substrate without buried layer 2 is used, the pattern will be transferred to the top layer 3.

FIG. 3 shows the substrate 10 in a further stage of the method. This process is achieved after selectively growing a directional photonic crystal layers 4,5 of a III-nitride type material on the remaining part of the substrate surface 110. The pattern of the directional photonic crystal layers 4,5 is extended from and substantially identical to the pattern in the top layer 3 of the substrate 10. In the present embodiment, the handling wafer 1 is comprises silicon. As a consequence of its exposure, III-nitride material will further grow in the exposed areas of the handling wafer 1 to create dots 14. These dots 14 are not functional, but do not disturb either.

In one embodiment, the directional photonic crystal layers 4,5 comprises a material with an aluminium content of at least about 20%. Therewith, it is achieved that confined growth (also referred to as vertical growth) occurs, instead of lateral overgrowth. The confined growth may however also be achieved alternatively. More specifically, the directional photonic crystal layer comprise $Al_xGa_{1-x}N$, wherein the Al molar ratio x is approximately $0.25 \leq x \leq 1$. The directional photonic crystal layer can comprise multiple layers having different Al molar ratios, or a single layer having a gradual Al molar ratio, with the highest Al ratio at the interface with silicon. Overlying and in contact with silicon an AlN layer (x=1) is first grown. Thereafter, an $Al_xGa_{1-x}N$ layer with constant or gradual Al molar ratio is grown, wherein approximately $0.25 \leq x < 1$.

In an alternative embodiment, use is made of a template (29) on top of the first surface for defining the directional photonic crystal layer and structure. Use could be made of an amorphous oxide or of a thermal oxide. After growth of the photonic crystal layer, this template may again be removed. Alternatively, the removal takes place after completion of the growth process and removal of the substrate.

In the embodiment shown in FIG. 3, a first and a second directional photonic crystal layer 4,5 are shown. The presence of more than a single directional photonic crystal layer is not deemed necessary, but may be beneficial. For instance, the composition of the first directional photonic crystal layer 4 may be different from the second directional photonic crystal layer 5. As a result, the diameter of the trenches 12 may be reduced within the second directional photonic crystal layer 5. It is deemed appropriate to provide a nucleation layer directly on the top layer 3, which is particularly a layer of AlN. This AlN is deemed to provide a better matching between the silicon material of the top layer 3 and the Ga-containing III-nitride materials grown afterwards. Suitably, a single directional photonic crystal layer with a gradually changing Al content is used. More particularly, this layer has an Al content that decreases towards the interface with the overgrowth layer 6. It has been found that such a layer with this Al composition gradient has antireflective properties. As a result, there is no need to apply a separate antireflection coating.

FIG. 4 shows the semiconductor body 50 obtained after further processes of the manufacturing method in accordance with one embodiment. A first of these processes is the growth of an overgrowth layer 6 of a III-nitride type material by means of epitaxial lateral overgrowth (ELOG), therewith overgrowing the trenches 12, and creating tips 15 of the trenches 12. A further process is the growth of an active layer structure of III-nitride type materials comprising a first active layer 8 that is n-type doped layer, a quantum well structure 28 and a second active layer 9 that is p-type doped. An intermediate process is the provision of a transition layer 7 on top of the overgrowth layer 6.

The formation of the overgrowth layer 6 occurs by means of epitaxial lateral overgrowth (ELOG), as known per se in the art, which is further tuned to achieved a gradual overgrowth. In the embodiment shown in this FIG. 4, the overgrowth occurs so as to form sidewalls that include an angle of approximately 40 degrees. The transition layer 7 may be formed directly after the overgrowth layer 6, even in a single process. The compositions of the overgrowth layer 6 and the transition layer 7 do not necessarily differ. However, it is preferred that the transition layer 7 merely inherently doped, or has the same doping as the overlying active layer 8 of the active layer structure.

The active layer structure is shown in the FIG. 4 to contain a first active layer 8 that is n-type doped and a second active layer 9 that is p-type doped. It suitably comprises a quantum well structure 28, as shown in FIG. 1. This quantum well structure 28 may be a single quantum well structure, a multiple quantum well structure, a superlattice and anything else known to the skilled person in the art as a quantum well. Beneficial examples include InGaN/GaN, InGaN/InGaN, InGaN/AlInGaN quantum wells. Though the quantum well structure 28 is depicted as a single layer, it may include multiple layers. Suitably, the p-type doped layer is the upper layer, in view of processing conditions related to the Mg-doping.

FIG. 5 shows again a further stage in the method according to one embodiment. At this stage, a carrier 20 has been bound to the structure by means of an adhesive layer 13. The carrier 20 is suitably a heat conductive material, such as a metal (f.i. copper), or an electrically insulating, heat conductive ceramic material. This type of carriers is well-known in the art of light emitting diodes and does not need any further discussion. The adhesive layer may be a polymer material, a solder, a metal suitable for making a connection between the semiconductor material of the active structure and the carrier 20. In case of a metal or alloy or the like, typical materials are Ti, TiN, TiW, TiNR, TiW, Ta, TaN, W and the like.

Figure 5:
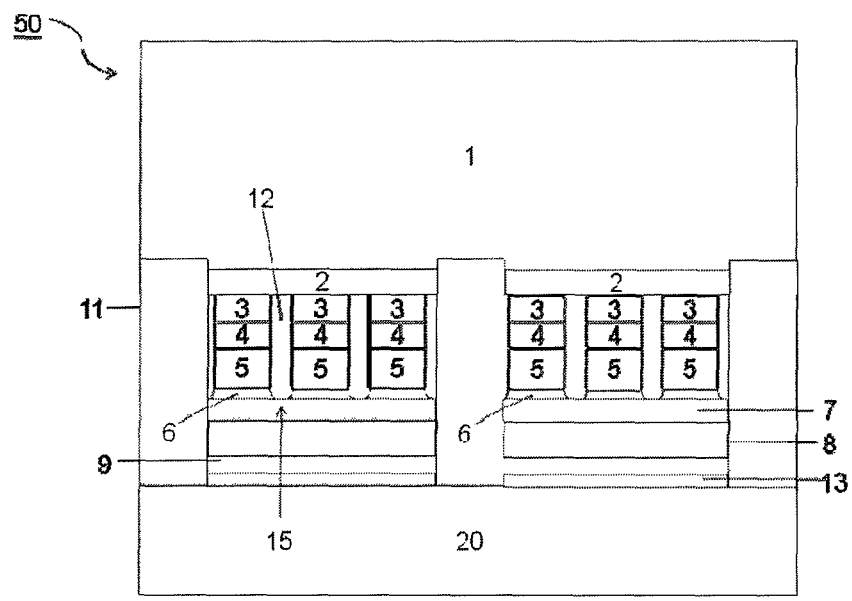
FIG. 5 shows a diagrammatical, cross-sectional view of a further stage of the method.
Figure 6:
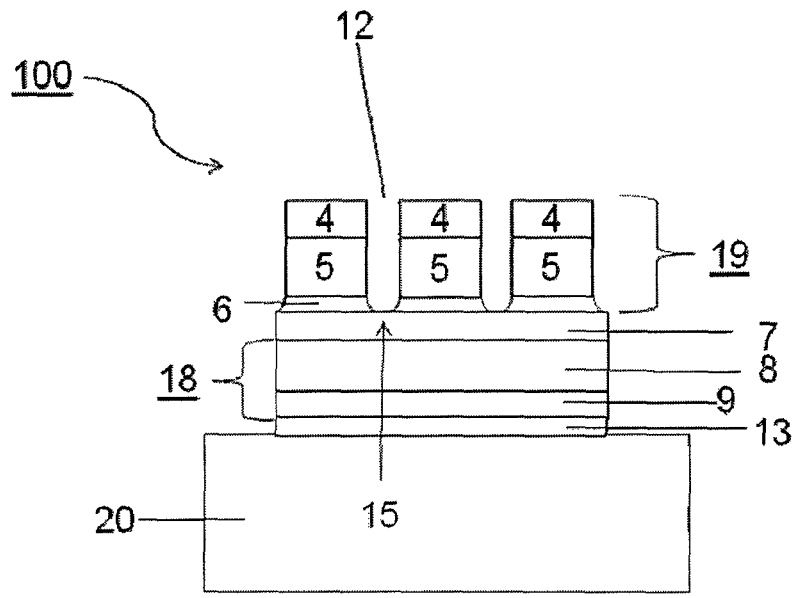
FIG. 6 shows a device according to one embodiment.

A further feature shown in FIG. 5 is the gaps 11. The gaps are for instance created by removal of material, so as to limit each of the devices into a typical mesa-structure. In an alternative embodiment, these gaps 11 are formed in that due to removal of the top layer 3, any growth of III-nitride layers has been prohibited locally. The gaps are not merely suitable for device isolation, but additionally to improve the removal of the substrate 10. Gaps 11 are suitably very large, approximately >5 micron, >10 micron or even 20 micron in order to avoid coalescence.

FIG. 6 shows the resulting light emitting diode 100, after removal of the substrate 10. The device comprises an active layer structure 18 and a photonic crystal structure 19 that is created from at least one directional photonic crystal layer 4,5 and the overgrowth layer 6. The transition layer 7 is present between the active layer structure 18 and the photonic crystal structure 19. In this embodiment the substrate 10 has been removed, including the handling wafer 1, the buried layer 2 and the top layer 3. However, if the top layer 3 is transparent for the radiation of the wavelength range of the light emitting diode 100, this top layer 3 does not need to be removed. After finalizing the removal process, a transparent protective layer—not shown—may be deposited onto the structure. Such a transparent layer is for instance a transparent epoxy or another transparent polymer as known in the art of packaging.

Removal of the substrate 10 is known per se as substrate transfer processing. In one embodiment, it is deemed suitable that to use a lift-off process rather than grinding and etching for the substrate removal. This lift-off process is particularly improved, in that the buried layer has already been removed partially during the processing. Particularly, channels may be envisaged in the buried layer, to assist the lift-off process. It is furthermore deemed an advantage to use an oxide as a buried layer, in view of etching selectivity between the oxide and the III-nitride type materials. The etchant may be a fluid, a vapor or a gas.

Figure 7:
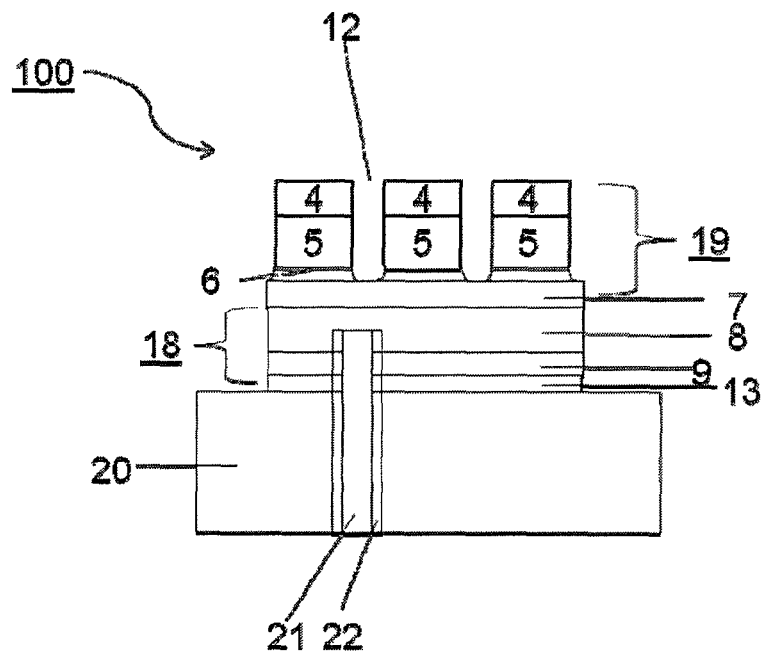
FIG. 7 shows a further version of the device of one embodiment.

FIG. 7 shows a further version of the device 100, wherein a contact 21 to the active layer structure 18 is shown. The FIG. 7 shows that the contact 21 extends to the n-type doped layer 8, but this is to be understood as an example. Furthermore, the contact 21 may alternatively be applied elsewhere in the device, for instance on the opposite side. The contact 21 is made through the carrier 20, and insulated from the carrier 20 with an electrically insulating layer 22. In this manner both contacts of the device 100 may be present on the same side, the carrier 20 being electrically conductive and acting as the other contact.

Figure 11:
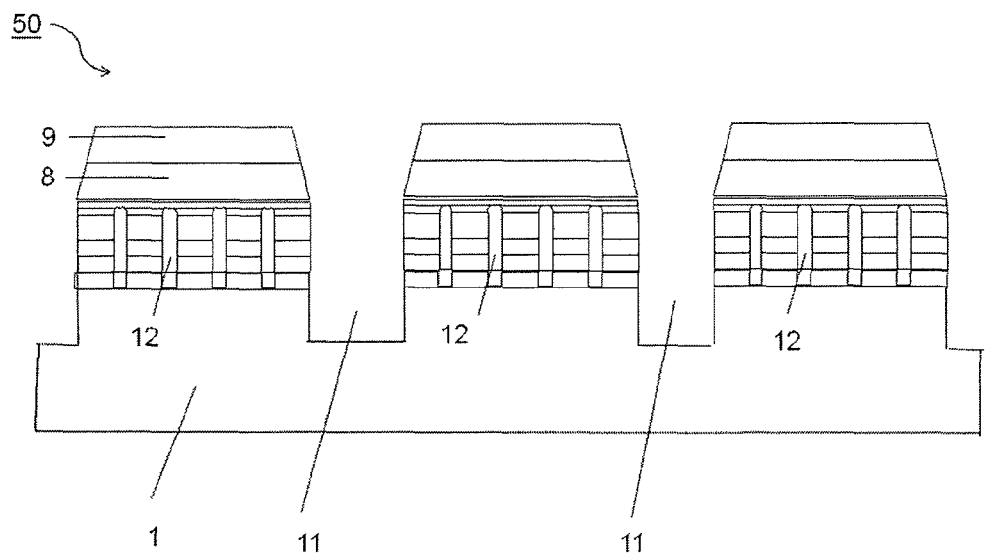
FIG. 11 shows a body in accordance with one embodiment.

FIG. 11 shows a modification of the growth process, wherein zones 11 are defined in the substrate in which growth of III-nitride materials is prevented. As a result hereof, the active layers 8, 9 may develop during growth with an inherent lateral limitation, i.e. even if lateral growth occurs, the large geometry of the gaps resulting in the individual layer stacks mutually being isolated. While the zones 11 may limit individual light emitting diodes, such zones may alternatively limit groups of light emitting diodes.

Figure 12:
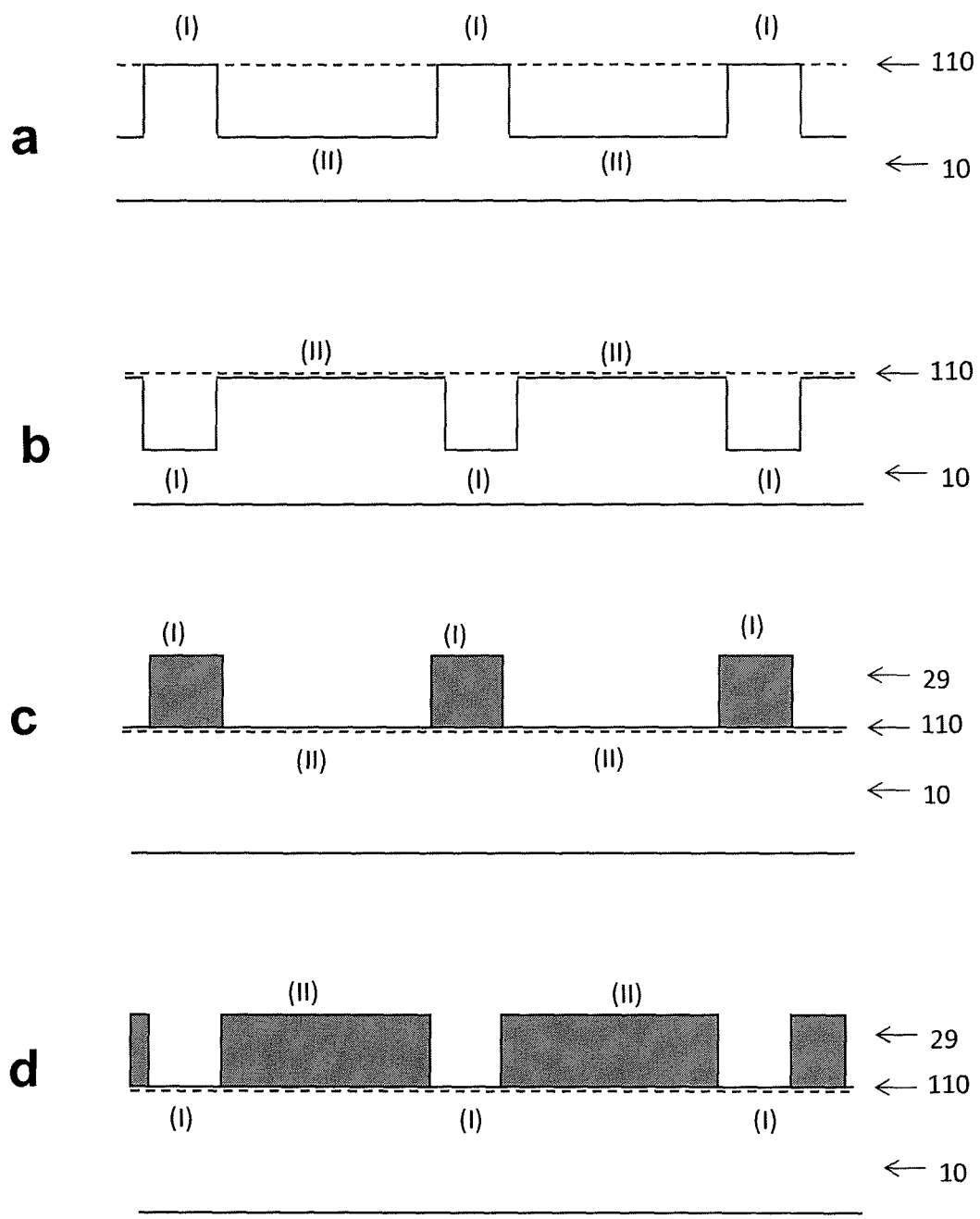
FIG. 12a-d shows a diagrammatical cross-sectional view of a substrate with an applied pattern in various embodiments as used in the method.

FIG. 12a-d shows diagrammatical, cross-sectional drawings of the substrate 10 to which a pattern is applied. The FIGS. 12a, 12b, 12c and 12d show herein alternative embodiment. In accordance with one embodiment, a pattern is applied to the substrate 10, so as to leave the first surface 110 of the substrate 10 exposed. This pattern is three-dimensional, e.g. comprises protrusions and cavities. As explained before, the first surface 110 could be exposed either in first areas (I) or in at least one second area (II). FIG. 12a and FIG. 12d show the embodiments wherein the first surface 110 is exposed in the first areas (I). FIG. 12b and FIG. 12c show the embodiments wherein the first surface 110 is exposed in the second areas (II).

Moreover, the pattern may be formed by patterning a top layer 13 of the substrate 10, i.e. by etching cavities into the top layer and optionally a buried layer 12. The first surface 110 is then exposed on top of protrusions. Alternatively, a template layer 29 is provided on top of the substrate. This template layer is patterned to define cavities, at a bottom of which the first surface 110 is exposed. FIG. 12a and FIG. 12b show the embodiments wherein the top layer of the substrate 10 is patterned, so that the first surface 110 is exposed on top of protrusions. FIG. 12c and FIG. 12d show the embodiments wherein a template layer 29 is provided, and the first surface 110 is exposed on the bottom of the cavities.

In short, it is a problem for forming photonic crystals in GaN that the etching process is not straightforward. The diameter of trenches generally is in the range of a few hundred nanometers while the thickness of the n-type GaN is about 4-6 micron. Therefore, a special etchant and recipe has to be developed to make such trenches with high aspect ratio (~20). Another option would be to thin down the n-type GaN thickness from about 5 micron to <1 micron. see J. J. Wierer et al Nature Photonics 3, 163 (2009), which is incorporated herein by reference.

In one embodiment, no etching process is required after epitaxy, which avoids potential damage to the active region (MQWs) during etching. Furthermore, the crystalline quality can be improved at the same time because of lateral overgrowth on patterned substrates. This is achieved in a growth process comprising three major phases, i.e. directional growth of the directional photonic crystal layer, overgrowth of trenches in an overgrowth layer and active layer growth, the latter typically comprising the formation of a quantum well structure. A transition layer may be defined between the overgrowth layer and the active layer. The directional growth occurs on top of a pattern that is three-dimensional. This enables a proper starting point for the directional growth. The pattern may even be a template defining the directional growth as growth in trenches within the template.

The resulting light emitting diode 100 comprises a carrier 20, an active layer structure 18 of III-nitride type materials, and a photonic crystal structure 19 of III-nitride type materials. The active layer structure 18 comprising a first active layer with an n-type doped layer 8 and a p-type doped layer 9 and suitably a quantum well structure 28. The photonic crystal structure 19 comprises periodically distributed trenches or periodically distributed pillars spaced by one or more trenches. The photonic crystal structure 19 comprises an overgrowth layer 6 within which a diameter of a trench gradually increases, and a directional photonic crystal layer 4,5 in which the diameter of a trench is substantially constant.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing at least one light emitting diode provided with a photonic crystal structure, the method comprising:
   (a) providing a substrate with a first surface suitable for growth of a III-nitride type material;
   (b) applying a pattern to the first surface, the pattern comprising periodically distributed first areas and at least one second area spatially limiting the first areas, the pattern being embodied by cavities and protrusions, one of which leaves the first surface exposed;
   (c) growing photonic crystal pillars of III-nitride type material on the first surface substantially in the first areas, when the first surface is exposed in the first areas;
   (d) growing at least one photonic crystal layer of III-nitride type material on the first surface substantially in the at least one second area, when the first surface is exposed in the at least one second area;
   (e) after the process c and d, growing an overgrowth layer of a III-nitride type material by epitaxial lateral overgrowth (ELOG) in both of the first areas and the at least one second area;
   (f) after the process e, growing an active layer structure of III-nitride type materials comprising a first active layer that is n-type doped layer and a second active layer that is p-type doped; and (g) removing the substrate at least partially for formation of the photonic crystal structure from the overgrowth layer and either the photonic crystal pillars or the photonic crystal layer, wherein the substrate comprises a handling wafer, a buried layer and a top layer, and wherein the pattern is applied in to the top layer, and wherein the removal of the substrate comprises removal of the handling wafer and the buried layer.

2. The method according to claim 1, wherein the photonic crystal structure is provided with one or more trenches between the photonic crystal pillars or with trenches in the photonic crystal layer, the trenches extending into the overgrowth layer and resulting from the process c or d, and are formed either in the process c or d or after the process c or d by removal of a template layer.

3. The method according to claim 1, wherein the pattern is transferred into the substrate, thereby defining the cavities in either the first areas or the at least one second area, the first surface being present on top of the protrusions.

4. The method according to claim 1, wherein the pattern is provided by application of a template layer on the substrate comprising the cavities, the first surface being present at a bottom of the cavities.

5. The method according to claim 2, wherein the overgrowth layer defines sidewalls to the trenches, the sidewalls comprising, between a first height and a second height within the overgrowth layer, an angle of on average at most 60 degrees with reference to a primary orientation of the trench.

6. The method according to claim 1, wherein subsequent to growing the overgrowth layer and prior to growing the active layer structure, at least one transition layer of a III-nitride material is grown.

7. The method according to claim 1, wherein the pattern is further transferred to the buried layer.

8. A light emitting diode manufactured by the method according to claim 1.

* * * * *

UNITED STATES PATENT AND TRADEMARK OFFICE
CERTIFICATE OF CORRECTION

PATENT NO. : 8,623,685 B2  
APPLICATION NO. : 13/092854  
DATED : January 7, 2014  
INVENTOR(S) : Cheng Page 1 of 1

It is certified that error appears in the above-identified patent and that said Letters Patent is hereby corrected as shown below:

In the Specification

In column 1 line 17, Change "(1 nAIGaN)" to --(InAlGaN)--.

In column 6 line 42, Change "protrustions," to --protrusions,--.

In column 12, line 37, Change "TiNR," to --TiNW,--.

Signed and Sealed this  
Twenty-sixth Day of August, 2014

Michelle K. Lee  
*Deputy Director of the United States Patent and Trademark Office*